United States Patent
Ouchi et al.

(10) Patent No.: US 9,820,400 B2
(45) Date of Patent: Nov. 14, 2017

(54) PACKAGE AND METHOD FOR FABRICATING PACKAGE

(71) Applicant: NEC TOSHIBA Space Systems, Ltd., Fuchu-shi, Tokyo (JP)

(72) Inventors: Rieka Ouchi, Fuchu (JP); Yasuhiro Ishii, Fuchu (JP); Hideki Tanaka, Fuchu (JP)

(73) Assignee: NEC SPACE TECHNOLOGIES, LTD., Tokyo (JP)

( * ) Notice: Subject to any disclaimer, the term of this patent is extended or adjusted under 35 U.S.C. 154(b) by 10 days.

(21) Appl. No.: 14/727,049

(22) Filed: Jun. 1, 2015

(65) Prior Publication Data

US 2015/0359121 A1    Dec. 10, 2015

(30) Foreign Application Priority Data

Jun. 4, 2014 (JP) ................................ 2014-115548

(51) Int. Cl.
*H05K 5/06* (2006.01)
*H01L 23/047* (2006.01)
(Continued)

(52) U.S. Cl.
CPC ......... *H05K 5/069* (2013.01); *H01L 21/4817* (2013.01); *H01L 21/4853* (2013.01); *H01L 23/047* (2013.01); *H01L 23/057* (2013.01); *H01L 23/08* (2013.01); *H01L 23/10* (2013.01); *H01L 24/32* (2013.01); *H01L 24/48* (2013.01); *H01L 24/73* (2013.01); *H01L 2224/32245* (2013.01); *H01L 2224/48091* (2013.01); *H01L 2224/48247* (2013.01); *H01L 2224/73265* (2013.01); *H01L 2924/00014* (2013.01);
(Continued)

(58) Field of Classification Search
USPC ..................................................... 174/50.56
See application file for complete search history.

(56) References Cited

U.S. PATENT DOCUMENTS

3,320,351 A * 5/1967 Glickman ............. H01L 23/047
174/50.56
3,381,080 A 4/1968 Stelmak
(Continued)

FOREIGN PATENT DOCUMENTS

FR    2121454 A1    8/1972
JP    2003-163300 A    6/2003
JP    2007-242379 A    9/2007

OTHER PUBLICATIONS

"Garasuita Gijyutsu Shiryo (Glass plates technical data)", online, browsed on May 16, 2014.
"Itagarasu No Sosei to Ippanteki Seishitsu (Composition and general properties of plate glass)", online, browsed on May 16, 2014.
"Houkeisan Garasu No Netsutokusei (Thermal properties of borosilicate glass)", online, Eikoh Co., Ltd., browsed on May 16, 2014.

(Continued)

*Primary Examiner* — Dhirubhai R Patel

(57) ABSTRACT

A package that hermetically seals an integrated circuit includes a metal lid (7) and a metal housing (10) having an open upper portion (12). In the package, the housing (10) includes in a wall surface thereof a glass unit (2) that seals a plurality of lead terminals therein. The glass unit (2) is disposed in a wall surface of the housing (10) such that a thickness in a vertical direction of the wall surface on an upper side of the glass unit (2) is determined according to a threshold limit value of a difference in temperature between glass that forms the glass unit (2) and metal that forms the wall surface.

8 Claims, 7 Drawing Sheets

(51) Int. Cl.
*H01L 23/08* (2006.01)
*H01L 21/48* (2006.01)
*H01L 23/057* (2006.01)
*H01L 23/10* (2006.01)
*H01L 23/00* (2006.01)

(52) U.S. Cl.
CPC .............. *H01L 2924/16195* (2013.01); *Y10T 29/49149* (2015.01)

(56) References Cited

U.S. PATENT DOCUMENTS

| | | |
|---|---|---|
| 4,412,093 A | 10/1983 | Wildeboer |
| 5,315,155 A | 5/1994 | O'Donnelly et al. |
| 2003/0068907 A1 | 4/2003 | Morte et al. |

OTHER PUBLICATIONS

"Houkeisan Garasu Kanren Seihin (Borosilicate glass-related products), Hyo 3 Butsuriteki Eishitsu (Table 3 Physical properties), Iwaki TE-32", online, Meijo Science Co., Inc., browsed on May 16, 2014.
"Garasu Q&A", online. Nichiden-Rika Glass Co., Ltd., browsed on May 16, 2014.
"Denshi Buhin You Garasu (Glass for electronic components), 25th edition, catalog", Nippon Electric Glass Co., Ltd.
Extended European Search Report for EP Application No. EP15166568.4 dated Dec. 1, 2015.

* cited by examiner

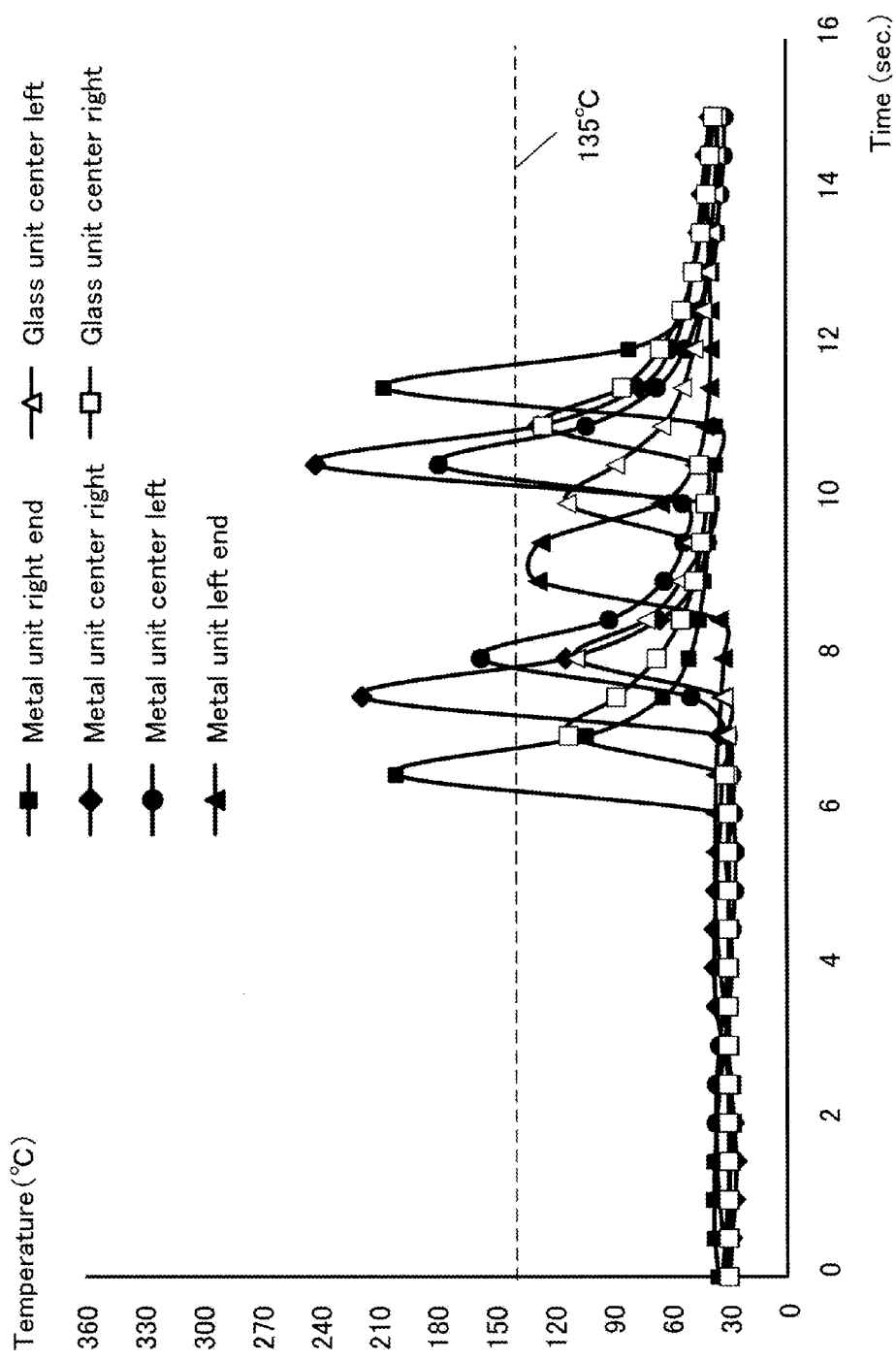

PACKAGE AND METHOD FOR FABRICATING PACKAGE

This application is based upon and claims the benefit of priority from Japanese patent application No. 2014-115548, filed on Jun. 4, 2014, the disclosure of which is incorporated here in its entirety by reference.

TECHNICAL FIELD

The present invention relates to a package that hermetically seals a high integrated circuit and a method for fabricating the package.

BACKGROUND ART

Patent Literature 1 discloses an exemplary package that represents a system of hermetically sealing a lead terminal in a lead terminal sealing hole using a glass material. The exemplary package disclosed in Patent Literature 1 includes a metal container. A bottom portion or a side wall portion of the metal container has a plurality of lead terminal sealing holes (hereinafter referred to simply as terminal sealing holes). A glass material is applied to the terminal sealing holes to thereby hermetically seal the lead terminals.

The system disclosed in Patent Literature 1 provides one terminal sealing hole for each lead terminal. This system has a limit to the number of lead terminals to be housed at one time, as encountered when an integrated circuit (IC) or other metal package is to be designed. Take, for example, a square Kovar metal package having one side measuring 50 mm in length. To drill terminal sealing holes in a wall surface of the package in order to house the corresponding number of lead terminals, the number of lead terminals per side is limited to 38. The package has a configuration in which lead terminals are extended from all four sides. When the total number of pins is 352, for example, it becomes necessary to house 88 (=352/4) lead terminals in one hole. To increase the number of external terminals in metal packages, a plurality of lead terminals needs to be housed in one terminal sealing hole.

Patent Literature 2 discloses a metal package structure that allows a plurality of conductors to be sealed in one terminal sealing hole. The metal package disclosed in Patent Literature 2, however, includes conductors metalized on a ceramic segment instead of having a lead shape. Thus, when a ceramic substrate having a metalized conductor is passed through a glass sealing frame formed on a wall surface of an IC or other metal package, no device is available to connect to a motherboard on which the metal package is mounted, or it is extremely inconvenient to connect to the motherboard. This is because of the following reasons. Specifically, wiring of the ceramic substrate defies soldering for mounting the ceramic substrate on the motherboard. Moreover, performing wire bonding requires that surface treatment be changed. Performing wire bonding for wiring connections on the inside of the package involves bonding of the ceramic substrate that protrudes horizontally like eaves on the inside of the package. In this case, however, a plurality of wires is connected to one ceramic substrate. This connection step can damage the ceramic substrate due to, for example, bonding load and ultrasonic waves.

PRIOR ART DOCUMENTS

Patent Literatures

[Patent Literature 1] Japanese Patent Application Laid-Open No. 2003-163300

[Patent Literature 2] Japanese Patent Application Laid-Open No. 2007-242379

Non-Patent Literatures

[Non-patent Literature 1] "GARASUITA GIJYUTSU SHIRYO (Glass plates technical data)", online, browsed on 16 May 2014, Internet URL: www.sekiyarika.com/ita/ita_05.html

[Non-patent Literature 2] "ITAGARASU NO SOSEI TO IPPANTEKI SEISHITSU (Composition and general properties of plate glass)", online, browsed on 16 May 2014, Internet URL: glass-catalog.jp/pdf/g01-010.pdf

[Non-patent Literature 3] "HOUKEISAN GARASU NO NETSUTOKUSEI (Thermal properties of borosilicate glass)", online, Eikoh Co., Ltd., browsed on 16 May 2014, Internet URL: www.duran-glass.com/feature/heat.html

[Non-patent Literature 4] "HOUKEISAN GARASU KANREN SEIHIN (Borosilicate glass-related products), HYO 3 BUTSURITEKI SEISHITSU (Table 3 Physical properties), IWAKI TE-32", online, Meijo Science Co., Inc., browsed on 16 May 2014, Internet URL: www.meijo-glass.co.jp/seihin/seihin_2.html

[Non-patent Literature 5] "GARASU Q&A (Glass Q&A)", online, Nichiden-Rika Glass Co., Ltd., browsed on 16 May 2014, Internet URL: www.nichiden-rika.com/data/qa

[Non-patent Literature 6] "DENSHI BUHIN YOU GARASU (Glass for electronic components), 25th edition, catalog", Nippon Electric Glass Co., Ltd.

SUMMARY

An exemplary object of the invention is to provide a package capable of maintaining even greater pressure resistance even when a high integrated circuit is hermetically sealed and provide a method for fabricating the package.

To achieve the foregoing object, the present invention provides a package that hermetically seals an integrated circuit and that comprises a metal lid and a metal housing having an open upper portion. In the package, the housing includes in a wall surface thereof a glass unit which seals a plurality of lead terminals therein. In addition, the glass unit is formed in the wall surface such that a thickness in a vertical direction of the wall surface on an upper side of the glass unit is determined according to a threshold limit value of a difference in temperature between glass that forms the glass unit and metal that forms the wall surface.

The present invention provides a method for fabricating a package that hermetically seals an integrated circuit with use of a metal housing having an open upper portion and of a metal lid. The method comprises, when a glass unit which seals a plurality of lead terminals therein is formed in a wall surface of the housing, forming the glass unit such that a thickness in a vertical direction of the wall surface on an upper side of the glass unit is determined according to a threshold limit value of a difference in temperature between glass that forms the glass unit and metal that forms the wall surface.

BRIEF DESCRIPTION OF THE DRAWINGS

FIG. 5 is a graph illustrating exemplary measurements of temperatures of the metal unit and the glass unit during a sealing process.

DESCRIPTION OF EXEMPLARY EMBODIMENT

First Exemplary Embodiment

A first exemplary embodiment of the present invention will be described below with reference to the accompanying drawings.

Figure 1:
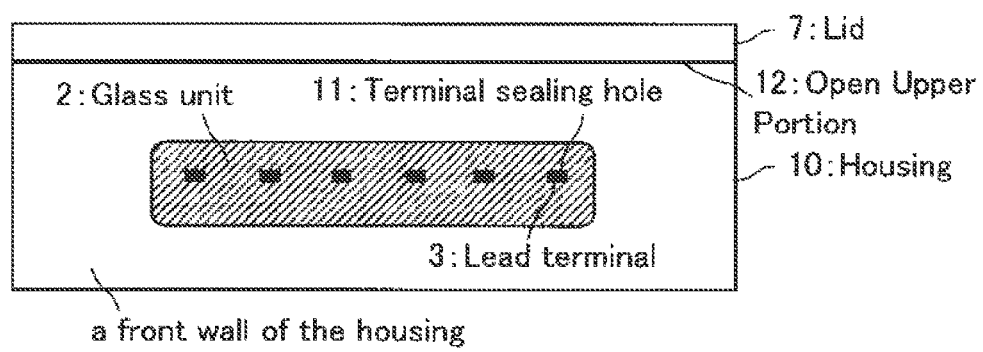
FIG. 1 is a diagram illustrating a configuration of a package according to a first exemplary embodiment of the present invention.

FIG. 1 is a diagram illustrating a configuration of a package according to the first exemplary embodiment of the present invention. FIG. 1 is a front elevational view of the package.

Figure 2:
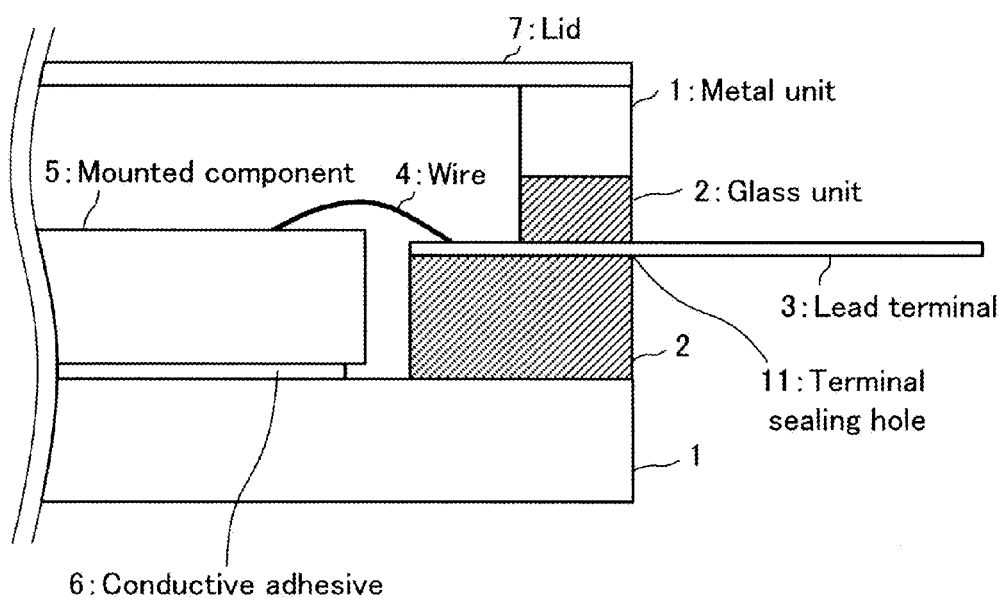
FIG. 2 is a cross-sectional view of the package according to the first exemplary embodiment of the present invention.

FIG. 2 is a cross-sectional view of the package according to the first exemplary embodiment of the present invention. FIG. 2 is a cross-sectional view of the package taken along a longitudinal direction of a lead terminal.

As shown in FIGS. 1 and 2, the package according to the first exemplary embodiment of the present invention includes a housing 10 and a lid 7. The housing 10 includes a metal unit 1, a glass unit 2, and a lead terminal 3. The housing 10 has an open upper portion 12.

The metal unit 1 forms a bottom surface and a wall surface of the housing 10. In the first exemplary embodiment, Kovar is used as the material for the metal unit 1. Any other metal may be used as long as the metal has corrosion resistance.

Figure 3A:
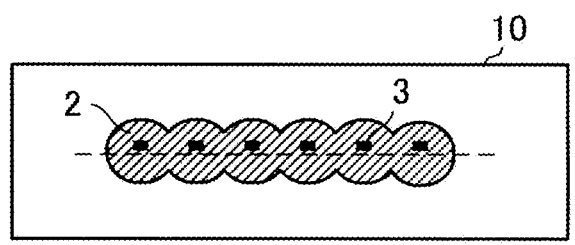
FIG. 3A is a diagram illustrating an exemplary shape of an interface between a metal unit and a glass unit.
Figure 3B:
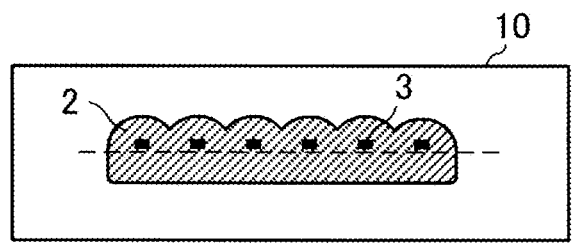
FIG. 3B is a diagram illustrating another exemplary shape of the interface between the metal unit and the glass unit.

The housing 10 has the wall surface that has an oblong hole (a terminal sealing hole 11 shown in FIG. 1) formed therein in advance. The terminal sealing hole 11 receives a plurality of lead terminals 3 inserted therethrough. While FIG. 1 shows an oblong rectangular hole, the hole may be shaped such that an interface between the metal unit 1 and the glass unit 2 is continuously wavy (for example, the interface forms a shape of a plurality of semicircles joined to each other as shown in FIG. 3A). The formation of the wavy interface allows pressure that builds up as a result of expansion of the metal unit 1 during a sealing process to be distributed among peaks (or valleys), so that the interface between the metal unit 1 and the glass unit 2 is even harder to be separated. It is noted that, as shown in FIG. 3B, only the upper interface of the entire interface between the metal unit 1 and the glass unit 2 may be continuously wavy.

Poor heat transfer from the metal unit 1 to the glass unit 2 or a difference in thermal conductivity between the metal unit 1 and the glass unit 2 results in a difference in temperature between the metal unit 1 and the glass unit 2. Thus, even though the metal unit 1 has a coefficient of thermal expansion substantially identical to a coefficient of thermal expansion of the glass unit 2, the temperature difference occurs between the metal unit 1 and the glass unit 2 and when the temperature difference exceeds a threshold limit value (hereinafter referred to as a threshold temperature difference), the glass unit 2 may be damaged or separated by thermal shock. In the first exemplary embodiment of the present invention, therefore, a distance is set between a wall upper surface of the metal unit 1 and the interface of the glass unit 2 so that the temperature difference between the metal unit 1 and the glass unit 2 does not exceed the threshold temperature difference in the sealing process by local heating.

The glass unit 2 is glass (hereinafter referred to as sealing glass) fixedly attached to an inside of the terminal sealing hole 11 for sealing the lead terminal 3 (see FIG. 2). Powdered glass of a material, such as $Na_2O$—$Al_2O_3$—$B_2O_3$—$SiO_2$, is used for the glass unit 2. As shown in FIG. 2, a section of the glass unit 2 extending beneath the lead terminal 3 has a depth (a length in the horizontal direction in FIG. 2) set to match with a length of a portion of the lead terminal 3 protruding to an inside of the housing 10, so that the section can support the protruding portion. In the first exemplary embodiment of the present invention, the depth of the glass unit 2 is set to be equal in length to the portion of the lead terminal 3 protruding to the inside of the housing 10.

The following describes a method for forming the glass unit 2. The method to be described hereunder forms the glass unit 2 in a shape as shown in FIG. 3A, instead of a cylindrical shape found in common sealing glass as that disclosed in Patent Literature 1.

Pressure (e.g., several kilograms) is applied to the powdered glass forced into a metal mold that can form a shape corresponding to the terminal sealing hole 11 to thereby prepare molded glass (hereinafter referred to as preformed glass).

At this time, an upper preformed glass half on the lid side and a lower preformed glass half on the bottom side (upper and lower with respect to the lead terminal 3) are prepared, for example, and the upper preformed glass half and the lower preformed glass half each have a continuous form of semicircles joined to each other. The interfaces on the lid side and on the bottom side may at this time be formed so that a lead terminal pitch does not tend to be deviated during firing. When the interfaces on the lid side and on the bottom side are each a straight line, for example, glass that flows into a gap between two adjacent lead terminals placed between the lid side and the bottom side is likely to shift the pitch during firing. Thus, the interfaces the preformed glass on the lid side and on the bottom side may, for example, be formed to be wavy so as to fill each gap between two adjacent lead terminals. This arrangement enables each lead terminal to be reliably positioned. Additionally, dividing the preformed glass into the upper and lower halves allows the depth of the glass unit 2 on the lower side of the lead terminal 3 to be easily set.

The preformed glass is next fitted into the terminal sealing hole 11 and fired together with the housing 10.

The firing may be performed in whether a batch furnace or a reflow furnace if the furnace is capable of increasing its temperature to a level at which the powdered glass melts. A jig may be used to prevent molten glass from flowing down during the firing.

After the firing, the whole housing is subject to plating. In general, the plating includes plating to 2 micrometers (hereinafter abbreviated to µm) to 6 µm in electrolytic Ni, followed by plating to 2 µm to 6 µm in electrolytic Au.

The foregoing steps form the glass unit 2 as shown in FIG. 3A.

The lead terminal 3 is connected via a wire 4 to a mounted component 5 mounted inside the package.

The following describes how components are mounted inside the package.

A component (mounted component 5) is mounted on, for example, a ceramic substrate and the ceramic substrate is fixed to the inside of the package by a conductive adhesive 6. The ceramic substrate and the lead terminal 3 that protrudes to the inside of the housing 10 are electrically connected to each other by, for example, wire bonding. Finally, while helium or other inert gas is being packed, the lid 7 is welded by laser sealing.

As described above, in the package according to the first exemplary embodiment, the terminal sealing hole 11 is formed into an oblong shape and is designed to allow a plurality of lead terminals 3 to be inserted in one terminal sealing hole 11. This arrangement achieves a narrow pitch and increases the total number of pins per package. In addition, the distance between the wall upper surface of the metal unit 1 sealed by the lid 7 and the interface of the glass unit 2 is set so that the temperature difference between the metal unit 1 and the glass unit 2 does not exceed the threshold temperature difference during the sealing process by local heating. This arrangement avoids damage or separation of the glass unit 2 caused by local heating. Specifically, the first exemplary embodiment can achieve a package that can hermetically seal a high integrated circuit and that has a pressure-resistant structure.

In the first exemplary embodiment, the depth of the glass unit 2 on the lower side of the lead terminal 3 is set to match with the length of the portion of the lead terminal 3 protruding to the inside of the package. This arrangement allows the lead terminal 3 that protrudes to the inside of the package to be supported from below. Thus, even when a plurality of wires is connected to one lead terminal 3, damage by, for example, bonding load can be avoided.

In the first exemplary embodiment, the distance between the wall upper surface of the metal unit 1 and the interface of the glass unit 2 is set in consideration of the threshold temperature difference between the metal unit 1 and the glass unit 2. The distance may still be set also in in consideration of cracking in the glass unit 2. For example, a height is found at which the metal unit 1 is hard to flex in a direction in which the metal unit 1 collapses the glass unit 2 and this height may be set for the distance between the wall upper surface of the metal unit 1 and the interface of the glass unit 2. This configuration prevents the metal unit 1 disposed on the upper side of the glass unit 2 from being flexed by, for example, external pressure, so that the glass unit 2 is less likely to crack. Specifically, the first exemplary embodiment can achieve a package that can withstand evacuation, a pressurization test, or the like.

Preferably, the lead terminal 3 is disposed on the upper side of a centerline in a thickness direction of the glass unit 2 (the vertical direction in FIG. 2). This is because of the following reason. Specifically, because glass has a low thermal conductivity, disposing the glass unit 2 in the package so as to be thinner on the upper side of the lead terminal 3 allows heat from a sealing portion to be more readily transmitted to the lead terminal 3. This specifically prevents the temperature of the metal unit 1 from rising, so that the temperature difference between the metal unit 1 and the glass unit 2 is less likely to exceed the threshold temperature difference during the sealing process by local heating.

FIRST EXAMPLE

The following describes a specific working example of the present invention.

The following describes, with reference to data provided in Non-patent Literatures 1 to 6, a method for establishing a thickness of the metal unit 1 formed of Kovar (specifically, the distance between the wall upper surface of the metal unit 1 and the interface of the glass unit 2) when the glass structure of the glass unit 2 is $Na_2O$—$Al_2O_3$—$B_2O_3$—$SiO_2$. Assume exemplarily that the package has an overall thickness of 5 mm and is shaped into a square having one side measuring 50 mm in length.

The glass having a structure of $Na_2O$—$Al_2O_3$—$B_2O_3$—$SiO_2$ (hereinafter referred to simply as $Na_2O$—$Al_2O_3$—$B_2O_3$—$SiO_2$) has a coefficient of thermal expansion greater than a coefficient of thermal expansion of ordinary heat-resistant borosilicate glass (hereinafter referred to simply as borosilicate glass). The glass has an average coefficient of thermal expansion of $42.5 \times 10^{-7}/°$ C. (30 to 380° C.) (see Non-patent Literature 1).

Non-patent Literature 2 gives the following thermal conductivity and coefficient of thermal expansion for general properties of plate glass.

Thermal conductivity 1 W/(m·K) {0.86 kcal/mh° C.} (at 0° C.) Coefficient of thermal expansion $8.5 \times 10^{-6}/°$ C. (room temperature to 350° C.)

Non-patent Literature 3 gives the following thermal properties of the borosilicate glass.

Coefficient of thermal expansion (20 to 300° C.) $3.25 \times 10^{-6}$/K Thermal conductivity (at 90° C.) 1.2 W/(m·K)

Non-patent Literature 4 gives the following physical properties of the borosilicate glass.

Thermal conductivity (at 25° C.) (cal/cm·sec·° C.) 0.0026 Thermal conductivity (at 100° C.) (cal/cm·sec·° C.) 0.0030 Coefficient of thermal expansion (0 to 300° C.) $32.5 \times 10^{-7}/°$ C.

From the above data given in Non-patent Literatures 1 to 4, and the fact that $Na_2O$—$Al_2O_3$—$B_2O_3$—$SiO_2$ has composition substantially identical to composition of the borosilicate glass, a thermal conductivity of $Na_2O$—$Al_2O_3$—$B_2O_3$—$SiO_2$ was estimated to be 1.2 W/(m·K) which is substantially identical to a thermal conductivity of the borosilicate glass.

Thermal shock resistant temperature of $Na_2O$—$Al_2O_3$—$B_2O_3$—$SiO_2$ is then estimated from commonly available information. Typically, glass having smaller coefficients of thermal expansion can very often withstand sudden changes in temperature; specifically, such glass has a high thermal shock resistant temperature (see Non-patent Literature 5). Specifically, the thermal shock resistant temperature can be estimated from the coefficient of thermal expansion. It is noted that $Na_2O$—$Al_2O_3$—$B_2O_3$—$SiO_2$ and the borosilicate glass have a substantially identical thermal conductivity, but have coefficients of thermal expansion different from each other. Thus, the thermal shock resistant temperature of $Na_2O$—$Al_2O_3$—$B_2O_3$—$SiO_2$ can be estimated as the ratio of the coefficient of thermal expansion of $Na_2O$—$Al_2O_3$—$B_2O_3$—$SiO_2$ to the coefficient of thermal expansion of the borosilicate glass.

TEMPAX Float (a registered trademark) that has a coefficient of thermal expansion smaller, and a thermal conductivity higher, than those of $Na_2O$—$Al_2O_3$—$B_2O_3$—$SiO_2$ has a thermal shock resistant temperature of 175° C. when its wall thickness is 3.8 mm or smaller (see Non-patent Literature 6).

From the data for TEMPAX Float given in Non-patent Literature 6, TEMPAX Float having a wall thickness identical to the thickness of the glass unit 2 on the upper side of the lead terminal 3 is estimated to have a thermal shock resistant temperature of 175° C. It is noted that the thickness of the glass unit 2 on the upper side of the lead terminal 3 is 0.9 mm as will be described later.

The ratio of the coefficient of thermal expansion, at thermal shock resistant temperature, of $Na_2O$—$Al_2O_3$—$B_2O_3$—$SiO_2$ to that of the borosilicate glass as follows.

TEMPAX/$Na_2O$—$Al_2O_3$—$B_2O_3$—$SiO_2$=32.5/42.5

The above equation expresses the ratio.

From the above ratio of coefficients of thermal expansion, the thermal shock resistant temperature of $Na_2O$—$Al_2O_3$—$B_2O_3$—$SiO_2$ was estimated at about 135° C. This thermal shock resistant temperature was then assumed to be the threshold temperature difference between Kovar and $Na_2O$—$Al_2O_3$—$B_2O_3$—$SiO_2$.

The distance between the wall upper surface of the metal unit 1, at which the lid 7 and the housing 10 are sealed together, and the interface of the glass unit 2 is then set in consideration of the above threshold temperature difference. For example, setting a longer distance results in a greater volume of the metal unit 1 (greater heat capacity), preventing the temperature difference between the metal unit 1 and the glass unit 2 from becoming greater.

Figure 4A:
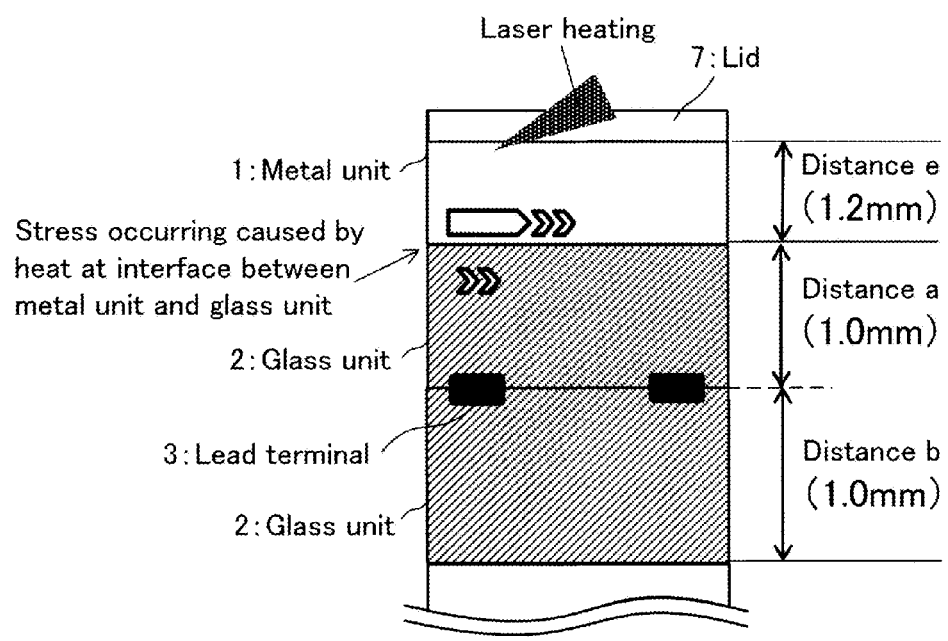
FIG. 4A is a diagram illustrating an exemplary mounting position of the glass unit.
Figure 4B:
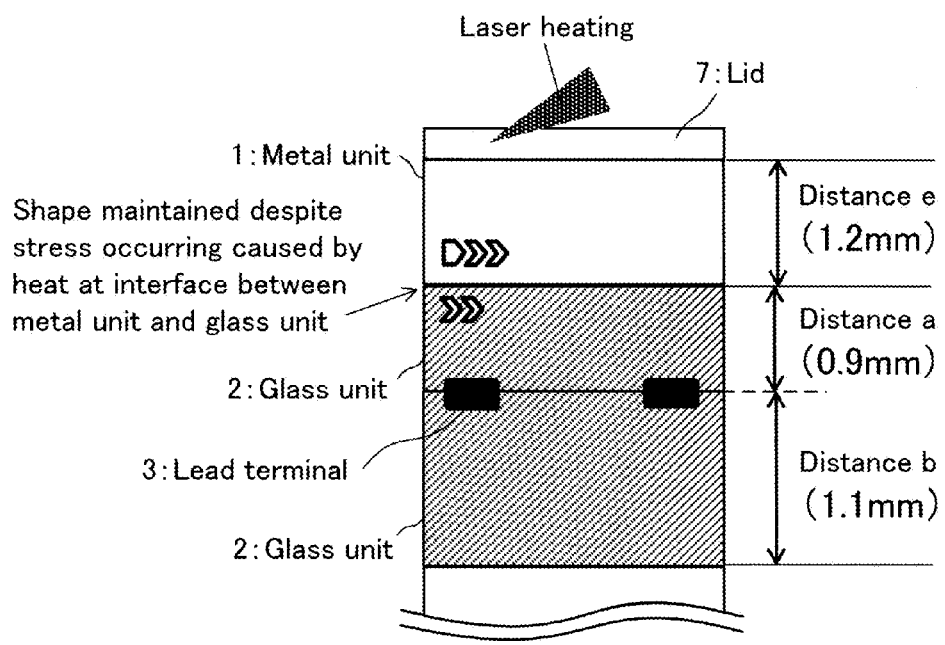
FIG. 4B is a diagram illustrating another exemplary mounting position of the glass unit.

In the first example, the distance between the wall upper surface of the metal unit 1 and the interface of the glass unit 2 was set to 1.2 mm. FIG. 4A is a diagram illustrating an exemplary mounting position of the glass unit 2. FIG. 4B is a diagram illustrating another exemplary mounting position of the glass unit 2. FIG. 4A is a front elevational view showing the package to which the present invention is yet to be applied. FIG. 4B is a front elevational view showing the package to which the present invention has been applied. The outlined arrows shown in FIGS. 4A and 4B each indicate stress caused by heat generated at the interface between the metal unit 1 and the glass unit 2. Each of the outline arrows has a length to represent a corresponding strength of the stress. As shown in FIGS. 4A and 4B, setting the distance between the wall upper surface of the metal unit 1 and the interface of the glass unit 2 (a distance e indicated in FIGS. 4A and 4B) to 1.2 mm causes the temperature difference between the metal unit 1 and the glass unit 2 to be less likely to be widened, thereby minimizing the stress caused by the heat generated at the interface between the metal unit 1 and the glass unit 2.

The lead terminal 3 is typically disposed at a center in the thickness direction of the package (in the vertical direction in FIGS. 4A and 4B). Thus, when the distance between the wall upper surface of the metal unit 1 and the interface of the glass unit 2 is designed from 0.8 mm to 1.2 mm, the thickness of the glass unit 2 on the upper side of the lead terminal 3 (a distance a indicated in FIGS. 4A and 4B) is decreased from 1.0 mm to 0.9 mm. Specifically, the lead terminal 3 is disposed on the upper side with respect to the centerline in the thickness direction of the glass unit 2. As a result, heat from the sealing portion is more readily transmitted to the lead terminal 3 as described earlier, so that the temperature difference between the metal unit 1 and the glass unit 2 is even less likely to be widened. Such a disposition of the lead terminal 3 can more readily be achieved through the use of the upper and lower preformed glass halves divided on the lid side and the bottom side with respect to the lead terminal 3. For example, the upper and lower preformed glass halves, the upper half being thinner than the lower half, need to be prepared.

Temperatures of the metal unit 1 and the glass unit 2 were measured using thermocouples affixed to positions near the interface between the metal unit 1 and the glass unit 2 during a sealing process. It was then confirmed that the temperature of the glass unit 2 was 135° C. or lower as shown in FIG. 5. FIG. 5 is a graph illustrating exemplary measurements of the temperatures of the metal unit 1 and the glass unit 2 during the sealing process. The graph shown in FIG. 5 shows the measurements of the temperatures at a right end, a center right position, a center left position, and a left end of the metal unit 1 on the upper side of the glass unit 2 (at a right end, a center right position, a center left position, and a left end in FIG. 4B), and at a center left position and a center right position of the glass unit 2 (at a center left position and a center right position in FIG. 4B). For the measurement process, thermocouples were affixed to a pre-sealing portion between the lid 7 and the housing 10, and the glass unit 2 and measurements were directly taken by irradiating the sealing portion with an Yttrium Aluminum Garnet (YAG) laser under the conditions for the sealing process.

Finally, the package was subjected to a leak test and passed the leak test without any problem.

The first example has been described for a case in which the glass unit 2 has a structure of $Na_2O$—$Al_2O_3$—$B_2O_3$—$SiO_2$. Glass having any other structure may nonetheless be employed for the glass unit 2. In this case, it is only required that the thermal shock resistant temperature of the adopted glass is obtained from the thermal conductivity and the coefficient of thermal expansion of the adopted glass.

The first example has been described for a case in which the package has an overall thickness of 5 mm and is shaped into a square having one side measuring 50 mm in length. The thickness and the size of the package may nonetheless be otherwise, if the package adopts local heating for its sealing method. In addition, the lead terminal may have any pitch other than that noted earlier. Specifically, any number of lead terminals may be sealed in one terminal sealing hole.

To further minimize effects of the difference in thermal conductivity between the metal unit 1 and the glass unit 2, preferably, the metal unit 1 has a greater heat capacity (a greater volume). For example, to manufacture the package by cutting, preferably, a columnar shape is left at respective four corners inside the housing 10 in order to increase the heat capacity of the metal unit 1. This arrangement tends more readily to avoid damage of the glass unit 2 or separation of the interface between the metal unit 1 and the glass unit 2.

The present invention is particularly applied to a field of high integrated circuits that are required to accommodate mounting of an even greater number of pins.

Figure 6:
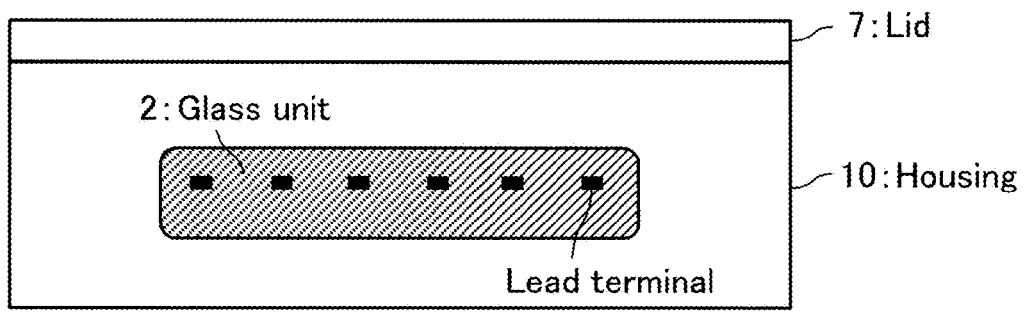
FIG. 6 is a diagram illustrating main components of the package according to the present invention.

FIG. 6 is a diagram illustrating main components of the package according to as aspect of the present invention. As shown in FIG. 6, the package according to the aspect of the present invention is a package that hermetically seals an integrated circuit, comprising the metal housing 10 having an open upper portion and the metal lid 7. The housing 10 includes the glass unit 2, which seals therein a plurality of lead terminals (that correspond to the lead terminals 3 shown in FIG. 1), disposed in the wall surface of the housing 10 such that a thickness in the vertical direction of the wall surface on the upper side of the glass unit 2 is determined according to a threshold limit value of the difference in temperature between glass that forms the glass unit 2 and metal that forms the wall surface (that corresponds to the metal unit 1 shown in FIG. 2).

The foregoing arrangement achieves a narrow pitch to thereby increase the total number of pins in the package and avoids damage or separation of the glass unit 2 caused by local heating during the sealing process. Specifically, the arrangement achieves a package that can hermetically seal a high integrated circuit and that has a pressure-resistant structure.

Preferably, the wall surface on the upper side of the glass unit 2 may be set to have a thickness such that the difference in temperature between the glass that forms the glass unit 2 and the metal that forms the wall surface during the process for sealing the housing 10 and the lid 7 does not exceed the thermal shock resistant temperature of the glass computed on the basis of the thermal conductivity and the coefficient of thermal expansion of the glass. This arrangement allows the threshold limit value of the difference in temperature between the glass unit 2 and the metal unit 1 to be accurately obtained, so that damage or separation of the glass unit 2 caused by local heating during the sealing process can be reliably avoided.

Preferably, the glass unit 2 may have a depth set to match with the length of the portion of the lead terminal protruding to the inside of the housing 10. This arrangement allows the lead terminal 3 that protrudes to the inside of the housing 10 to be supported from below. Thus, even when a plurality of wires is connected to one lead terminal 3, damage by, for example, bonding load can be avoided.

Preferably, the glass unit 2 may be formed so that the lead terminal 3 is disposed on the upper side with respect to the center in the vertical direction of the glass unit 2. This arrangement allows heat from the sealing portion to be more readily transmitted to the lead terminal 3. Specifically, the temperature of the metal unit 1 can be prevented from rising, so that the difference in temperature between the metal unit 1 and the glass unit 2 is less likely to exceed the threshold temperature difference during the sealing process by local heating.

Preferably, the interface between the wall surface of the housing 10 and the glass unit 2 may be shaped to be wavy. This arrangement allows pressure that builds up as a result of expansion of the metal that forms the wall surface of the housing 10 to be distributed among peaks (or valleys), so that the interface between the metal that forms the wall surface and the glass unit 2 is even harder to be separated.

Preferably, the package may include the columnar shapes each left at respective four corners inside the housing 10. This arrangement tends more readily to avoid damage of the glass unit 2 or separation of the interface between the wall surface of the housing 10 and the glass unit 2.

Glass sealing can be performed by widening the terminal sealing hole to accommodate therein a plurality of lead terminals. A large-sized package having a shape of a 50-mm-by-50-mm square, however, involves a large heat capacity. When the wall upper surface of the housing and the lid are sealed in such a large-sized package, it is difficult to heat the wall upper surface, while holding temperatures of components inside the package below the heat-resistant temperature. Thus, sealing by soldering cannot be employed. The sealing method by local heating is therefore the only possible technique to be used for joining the wall upper surface and the lid in such a large-sized package.

Because of a great difference involved in thermal conductivity between metal and glass, in a package that seals lead terminals in sealing glass, the sealing glass does not follow expansion of the metal during a sealing process by local heating, resulting at times in damaged sealing glass or a separated interface between the sealing glass and the metal. Such a package is, if not developing damage or separation during the sealing process, hard to withstand evacuation, a pressurization test, or the like.

The present invention enables even greater pressure resistance to be maintained even when a high integrated circuit is hermetically sealed.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The invention claimed is:

1. A package that hermetically seals an integrated circuit, the package comprising:
    a metal housing having an open upper portion; and
    a metal lid,
    wherein the metal housing includes a metal unit and a glass unit configured to hold a plurality of lead terminals in a central section of a front wall of the metal housing,
    wherein the glass unit includes lead terminals which are vertically arranged on an upper side of a horizontally extended centerline of the glass unit, and
    wherein a thickness in a vertical direction of the metal unit on an upper side of the glass unit is set such that heat capacity of the metal unit is set to a level where stress caused by a difference between a temperature of the glass unit and a temperature of the metal unit would not damage the glass unit when a process for sealing the metal housing and the metal lid is performed.

2. The package according to claim 1,
    wherein the glass unit has a depth set to match with a length of a portion of the lead terminals, the portion protruding to an inside of the housing.

3. The package according to claim 1,
    wherein an interface between the wall of the housing and the glass unit is formed to be wavy.

4. The package according to claim 1,
    wherein columnar shapes are metal columnar shapes, which are provided to increase heat capacity of the metal unit.

5. A method for fabricating a package that hermetically seals an integrated circuit with use of a metal housing having an open upper portion and of a metal lid, the method comprising:
    forming a metal housing having an open upper portion and a terminal sealing hole in a central section of a front wall of the metal housing,
    forming a preformed glass for holding a plurality of lead terminals,
    fitting the preformed glass into the terminal sealing hole, and
    firing the metal housing together with the preformed glass to form the housing having a glass unit,
    wherein, when forming the preformed glass, vertically arranging lead terminals on an upper side of the horizontally extended centerline of the preformed glass, and
    forming the glass unit such that a thickness in a vertical direction of a metal unit on an upper side of the glass unit is set such that heat capacity of the metal unit is set to a level where stress caused by a difference between a temperature of the glass unit and a temperature of the metal unit would not damage the glass unit when a process for sealing the metal housing and the metal lid is performed.

6. The method for fabricating a package according to claim 5, wherein the glass unit has a depth set to match with a length of a portion of the lead terminals, the portion protruding to an inside of the housing.

7. The method for fabricating a package according to claim 5, wherein, when forming the preformed glass, separately forming an upper preformed glass and a lower preformed glass.

8. The method for fabricating a package according to claim 5,
wherein an interface between the wall of the housing and the glass unit is formed to be wavy.

* * * * *